(12) United States Patent
Kim et al.

(10) Patent No.: US 6,992,514 B2
(45) Date of Patent: Jan. 31, 2006

(54) SYNCHRONOUS MIRROR DELAY CIRCUIT AND SEMICONDUCTOR INTEGRATED CIRCUIT DEVICE HAVING THE SAME

(75) Inventors: Nam-Seog Kim, Suwon-si (KR); Yong-Jin Yoon, Seoul (KR); Uk-Rae Cho, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 107 days.

(21) Appl. No.: 10/790,601

(22) Filed: Mar. 1, 2004

(65) Prior Publication Data

US 2004/0178836 A1 Sep. 16, 2004

(30) Foreign Application Priority Data

Mar. 13, 2003 (KR) .................. 10-2003-0015763

(51) Int. Cl.
*H03L 7/00* (2006.01)

(52) U.S. Cl. ...................................... 327/161; 327/158
(58) Field of Classification Search ................. 327/141, 327/149, 152, 153, 158, 161, 276–277, 284
See application file for complete search history.

(56) References Cited

U.S. PATENT DOCUMENTS

| | | | | | |
|---|---|---|---|---|---|
| 5,999,032 | A | * | 12/1999 | Wang et al. | 327/292 |
| 6,005,430 | A | * | 12/1999 | Brown et al. | 327/277 |
| 6,049,241 | A | * | 4/2000 | Brown et al. | 327/295 |
| 6,128,248 | A | * | 10/2000 | Idei et al. | 365/233 |
| 6,310,822 | B1 | * | 10/2001 | Shen | 365/233 |
| 6,396,322 | B1 | * | 5/2002 | Kim et al. | 327/158 |
| 6,489,824 | B2 | * | 12/2002 | Miyazaki et al. | 327/158 |
| 6,570,419 | B2 | * | 5/2003 | Hanzawa et al. | 327/152 |
| 6,608,514 | B1 | * | 8/2003 | Akita et al. | 327/291 |
| 6,806,753 | B2 | * | 10/2004 | Kawasumi | 327/261 |
| 6,822,925 | B2 | * | 11/2004 | Van De Graaff | 365/233 |
| 2003/0122598 | A1 | * | 7/2003 | Kim et al. | 327/158 |

FOREIGN PATENT DOCUMENTS

| | | |
|---|---|---|
| JP | 10-261288 | 9/1998 |
| KR | 0183870 | 12/1998 |

* cited by examiner

*Primary Examiner*—Terry D. Cunningham
*Assistant Examiner*—Cassandra Cox
(74) *Attorney, Agent, or Firm*—F. Chau & Associates, LLC (57) ABSTRACT

Disclosed is a synchronous mirror delay circuit for generating an internal clock signal synchronized with an external clock signal, comprising: a clock buffer circuit that generates a reference clock signal in response to the external clock signal; a delay monitor circuit that delays the reference clock signal; a forward delay array for delaying an output clock signal of the delay monitor circuit to generate delay clock signals; a mirror control circuit that receives the delay clock signals and the reference clock signal to detect one delay clock signal synchronized with the reference clock signal among the delay clock signals; a backward delay array that delays the delay clock signal detected by the mirror control circuit to output a synchronous clock signal; a delay circuit that delays an asynchronous clock signal output through the forward delay array; and a clock driving circuit that outputs the delayed asynchronous clock signal as the internal clock signal when the reference clock signal is not synchronized with one of the delay clock signals.

15 Claims, 9 Drawing Sheets

SYNCHRONOUS MIRROR DELAY CIRCUIT AND SEMICONDUCTOR INTEGRATED CIRCUIT DEVICE HAVING THE SAME

BACKGROUND OF THE INVENITON

1. Technical Field

The present invention relates to a semiconductor device, and more particularly, to a synchronous mirror delay circuit and a semiconductor integrated circuit device having the same.

2. Discussion of the Related Art

With the advance of complementary metal oxide semiconductor (CMOS) integrated circuit technology, an operating speed of an integrated circuit has been improved. In order to increase the operating speed of the integrated circuit, it is typically necessary to improve a clock signal used for driving the integrated circuit. This is accomplished by increasing a clock frequency of the clock signal. Among the problems that result due to increasing the clock signal's frequency, is a clock skew that occurs between an external clock signal and an internal clock signal. The resulting clock skew should be fixed because it can cause the integrated circuit to operate erroneously. Generally, a phase locked loop (PLL) circuit or a delay locked loop (DLL) circuit has been used to solve the clock skew. However, such circuits have a drawback in that a synchronization time is long. In order to solve this drawback, a synchronous mirror delay (SMD) circuit has been proposed. Existing SMD circuits generate an internal clock signal that is synchronized with an external clock signal in only two cycles.

Typical SMD circuits are disclosed in U.S. Pat. No. 6,060,920, entitled "MULTIPLEX SYNCHRONOUS DELAY CIRCUIT", and U.S. Pat. No. 6,373,913, entitled "INTERNAL CLOCK SIGNAL GENERATOR INCLUDING CIRCUIT FOR ACCURATELY SYNCHRONIZING INTERNAL CLOCK SIGNAL WITH EXTERNAL CLOCK SIGNAL".

The common clock generating circuits, such as SMD, PLL and DLL circuits, have predetermined synchronization ranges in which they typically operate. These clock generating circuits do not, however, operate properly when in a low frequency band out of their synchronization ranges. For example, as the operating frequency of an integrated circuit increases, an operating frequency of its associated test equipment does not increase in proportion to the increase in the operating frequency of the integrated circuit. This makes it difficult to test a high-speed semiconductor integrated circuit device by means of conventional test equipment operating at lower frequencies.

Accordingly, there is a need for a device that allows a high-speed semiconductor integrated circuit to operate normally when in a frequency band out of its synchronization range.

SUMMARY OF THE INVENTION

In accordance with one aspect of the present invention, there is provided a synchronous mirror delay circuit for generating an internal clock signal synchronized with an external clock signal, comprising: a clock buffer circuit for generating a reference clock signal in response to the external clock signal; a delay monitor circuit for delaying the reference clock signal; a forward delay array for delaying an output clock signal of the delay monitor circuit to generate delay clock signals; a mirror control circuit for receiving the delay clock signals and the reference clock signal and detecting one delay clock signal synchronized with the reference clock signal among the delay clock signals; a backward delay array for delaying the detected delay clock signal to output a synchronous clock signal; a delay circuit for delaying an asynchronous clock signal output through the forward delay array; and a clock driving circuit for outputting the delayed asynchronous clock signal as the internal clock signal when the reference clock signal is not synchronized with one of the delay clock signals.

The forward delay array comprises serially-connected delay units having the same delay time. The mirror control circuit comprises phase detectors corresponding to respective delay units, the phase detectors receiving the reference clock signal and the delay clock signal outputted from the corresponding delay unit.

The delay circuit is inactivated by an output signal of the last phase detector when the last phase detector detects the delay clock signal synchronized with the reference clock signal and the clock driving circuit outputs a synchronous clock signal output from the backward delay array as the internal clock signal when the reference clock signal is synchronized with one of the delay clock signals.

The delay monitor circuit comprises a second clock buffer circuit, a first driving circuit and a first regenerator circuit and, the clock driving circuit comprises a second driving circuit and a second regenerator circuit.

In accordance with another aspect of the present invention, there is provided a semiconductor integrated circuit device operating in synchronization with an external clock signal, comprising: a synchronous mirror delay circuit for generating an internal clock signal synchronized with the external clock signal; and a data input/output circuit for inputting and outputting data in synchronization with the internal clock signal. The synchronous mirror delay circuit comprises: a clock buffer circuit for generating a reference clock signal in response to the external clock signal; a delay monitor circuit for delaying the reference clock signal; a forward delay array for delaying an output clock signal of the delay monitor circuit to generate delay clock signals; a mirror control circuit for receiving the delay clock signals and the reference clock signal and detecting one delay clock signal synchronized with the reference clock signal among the delay clock signals; a backward delay array for delaying the delay clock signal detected by the mirror control circuit and outputting a synchronous clock signal; a delay circuit for delaying an asynchronous clock signal output through the forward delay array; and a clock driving circuit for outputting the delayed asynchronous clock signal as the internal clock signal when the reference clock signal is not synchronized with one of the delay clock signals.

The forward delay array comprises serially-connected delay units having the same delay time. The mirror control circuit comprises phase detectors corresponding to the delay units, the phase detectors receiving the reference clock signal and the delay clock signal outputted from the corresponding delay unit.

The delay circuit is inactivated by an output signal of the last phase detector when the last phase detector detects the delay clock signal synchronized with the reference clock signal and the clock driving circuit outputs a synchronous clock signal output from the backward delay array as the internal clock signal when the reference clock signal is synchronized with one of the delay clock signals.

In accordance with yet another aspect of the present invention, there is provided a method for generating an internal clock signal synchronized with an external clock signal, comprising the steps of: generating a reference clock signal in response to the external clock signal; delaying the reference clock signal; sequentially delaying an output clock signal to generate an asynchronous clock signal and delay clock signals; detecting one delay clock signal synchronized with the reference clock signal among the delay clock signals; delaying the detected delay clock signal to output a synchronous clock signal; and outputting the asynchronous clock signal as the internal clock signal, when the reference clock signal is not synchronized with one of the delay clock signals.

The method further comprises outputting the synchronous clock signal as the internal clock signal when the reference clock signal is synchronized with one of the delay clock signals. In addition, the asynchronous clock signal is not generated when the last delayed delay clock signal of the delay clock signals is synchronized with the reference clock signal.

BRIEF DESCRIPTION OF THE DRAWINGS

The features of the present invention will become more apparent by describing in detail exemplary embodiments thereof with reference to the attached drawings, in which.

DETAILED DESCRIPTION OF EXEMPLARY EMBODIMENTS

It is to be understood that the term "synchronization" as used herein means that phases of clock signals are synchronized without a clock skew.

Figure 1:
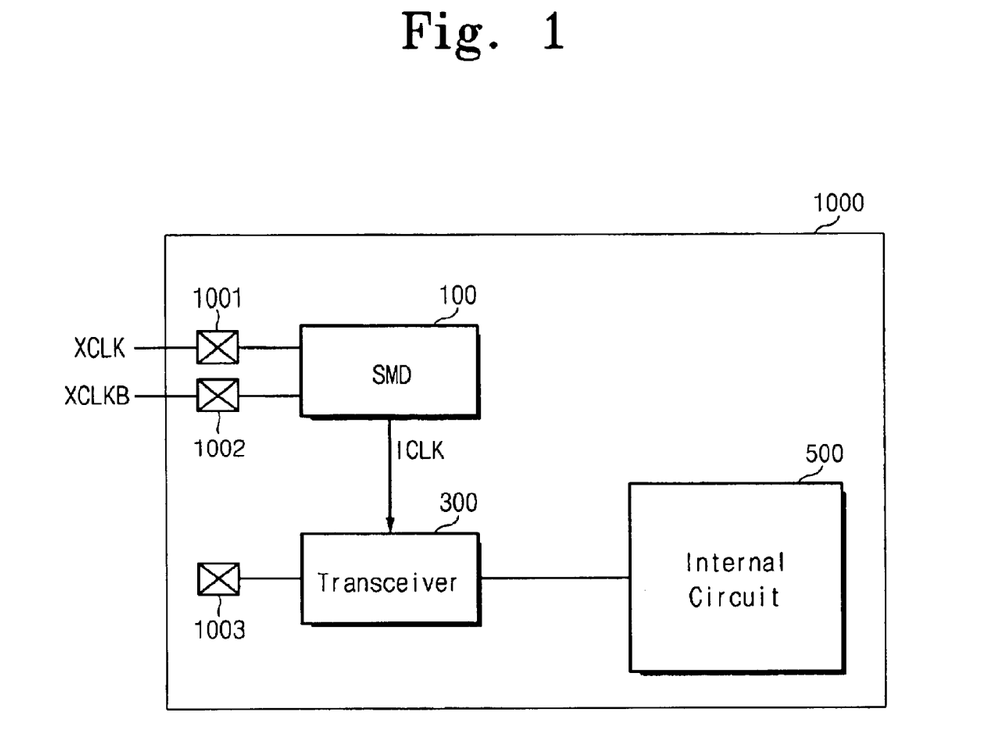
FIG. 1 is a schematic block diagram showing a semiconductor integrated circuit device including a synchronous mirror delay circuit according to an exemplary embodiment of the present invention.

FIG. 1 is a schematic block diagram showing a semiconductor integrated circuit device 1000 including a synchronous mirror delay (SMD) circuit 100 according to an exemplary embodiment of the present invention. The semiconductor integrated circuit device 1000 is a synchronous memory device, such as a double data rate (DDR) memory. As shown in FIG. 1, the semiconductor integrated circuit device 1000 includes the synchronous mirror delay circuit 100, a transceiver circuit 300, which is used as a data input/output circuit, and an internal circuit 500.

The synchronous mirror delay circuit 100 is connected to pads 1001 and 1002 for receiving an external clock signal XCLK and its complementary clock signal XCLKB, respectively, and generates an internal clock signal ICLK that is synchronized with the external clock signal XCLK. The transceiver circuit 300 is connected to a pad 1003 for receiving and outputting data, and receives and outputs data in synchronization with the internal clock signal ICLK generated by the synchronous mirror delay circuit 100. The internal circuit 500 receives data through the transceiver circuit 300 or outputs internally processed data to an exterior for example, the pad 1003, through the transceiver 300.

Figure 2:
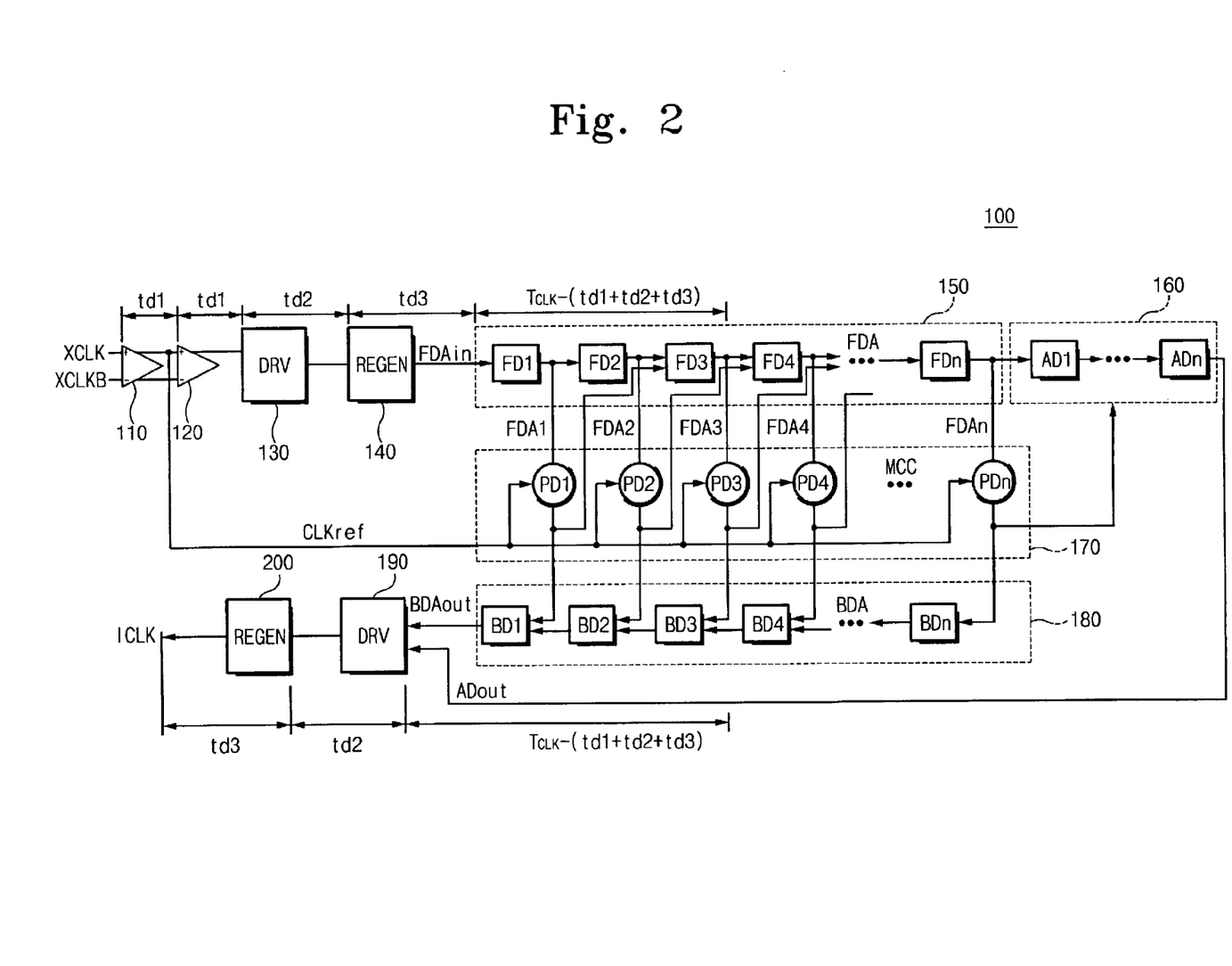
FIG. 2 is a block diagram showing the synchronous mirror delay circuit of FIG. 1 according to an exemplary embodiment of the present invention.

FIG. 2 is a block diagram showing the synchronous mirror delay circuit 100 of FIG. 1 according to an exemplary embodiment of the present invention. Referring to FIG. 2, the synchronous mirror delay circuit 100 includes two clock buffer circuits 110 and 120, two driving circuits (DRV) 130 and 190, two regenerator circuits (REGEN) 140 and 200, a forward delay array (FDA) 150, a delay circuit 160, a mirror control circuit (MCC) 170, and a backward delay array (BDA) 180. As shown in FIG. 2, the clock buffer circuit 120, the driving circuit 130 and the regenerator circuit 140 form a delay monitor circuit (DMC). The driving circuit 190 and the regenerator circuit 200 form a clock driver circuit.

The clock buffer circuit 110 receives the external clock signal XCLK and generates a reference clock signal CLKref of a one-shot pulse shape. The reference clock signal CLKref is delayed by a delay time "Td1" through the clock buffer circuit 110. The delay monitor circuit formed by the clock buffer circuit 120, the driving circuit 130 and the regenerator circuit 140 delays the reference clock signal CLKref output from the clock buffer circuit 110 by a delay time "Td1+Td2+Td3". The forward delay array 150 includes a plurality of serially-connected delay units FD1–FDn and outputs a plurality of delay clock signals FDA1–FDAn. Each of the delay units of the forward delay array 150 has the same delay time. The delay circuit 160 includes a plurality of serially-connected delay units AD1–ADn and delays the delay clock signal FDAn output from the last delay unit FDn of the forward delay array 150. The delay circuit 160 is controlled by the mirror control circuit 170.

Referring to FIG. 2, the mirror control circuit 170 includes a plurality of phase detectors PD1–PDn corresponding to respective delay units FD1–FDn of the forward delay array 150. Each of the phase detectors PDi (i=1, 2, ..., n) receives the reference clock signal CLKref and the delay clock signals FDAi (i=1, 2, ..., n) output from a corresponding delay unit FDi (i=1, 2, ..., n) of the forward delay array 150. Each phase detector PDi detects whether the inputted clock signals CLKref and FDAi have the same phase with each other. In other words, the mirror control circuit 170 detects the delay clock signal FDAi, which is delayed by one cycle compared with the reference clock signal CLKref output from the clock buffer circuit 110 where, the delay clock signal FDAi has a phase difference of one cycle. Thus, the delay time of the forward delay array 150 is "Tclk−(Td1+Td2+Td3)" at a synchronized position.

As further shown in FIG. 2, the delay units of the forward delay array 150 are controlled by the mirror control circuit 170.

The backward delay array 180 includes a plurality of serially-connected delay units BD1–BDn corresponding to respective phase detectors PD1–PDn of the mirror control circuit 170. Each of the delay units BDi (i=1, 2, . . . , n) has the same delay time as each of the delay units of the forward delay array 150. The driving circuit 190 receives the clock signal BDAout from the backward delay array 180 and the clock signal ADout from the delay circuit 160 and delays one of the received signals BDAout and ADout by a delay time "Td2". The regenerator circuit 200 delays the clock signal output from the driving circuit 190 by a delay time "Td3" and generates the delayed clock signal as the internal clock signal ICLK.

According to the synchronous mirror delay circuit 100, when one of the delay clock signals FDA1–FDAn output from the forward delay array 150 is synchronized with the reference clock signal CLKref, the driving circuit 190 outputs the clock signal BDAout output from the backward delay array 180 as the internal clock signal ICLK synchronized with the external clock signal XCLK. In other words, the internal clock signal ICLK that is within a synchronization range of the forward delay array 150 is generated and then supplied to the transceiver circuit 300 of FIG. 1. The transceiver circuit 300 then performs data input/output operations in synchronization with the internal clock signal ICLK. On the other hand, when one of the delay clock signals FDA1–FDAn output from the forward delay array 150 is not synchronized with the reference clock signal CLKref, the driving circuit 190 outputs the clock signal ADout output from the delay circuit 160. The clock signal ADout is out of the synchronization range of the forward delay array 150 and is not synchronized with the external clock signal XCLK. However, even though the external clock signal XCLK is out of a phase synchronization range, the internal clock signal ICLK is generated and then supplied to the transceiver circuit 300 of FIG. 1 and the transceiver circuit 300 performs data input/output operations in synchronization with the internal clock signal ICLK.

Figure 3:
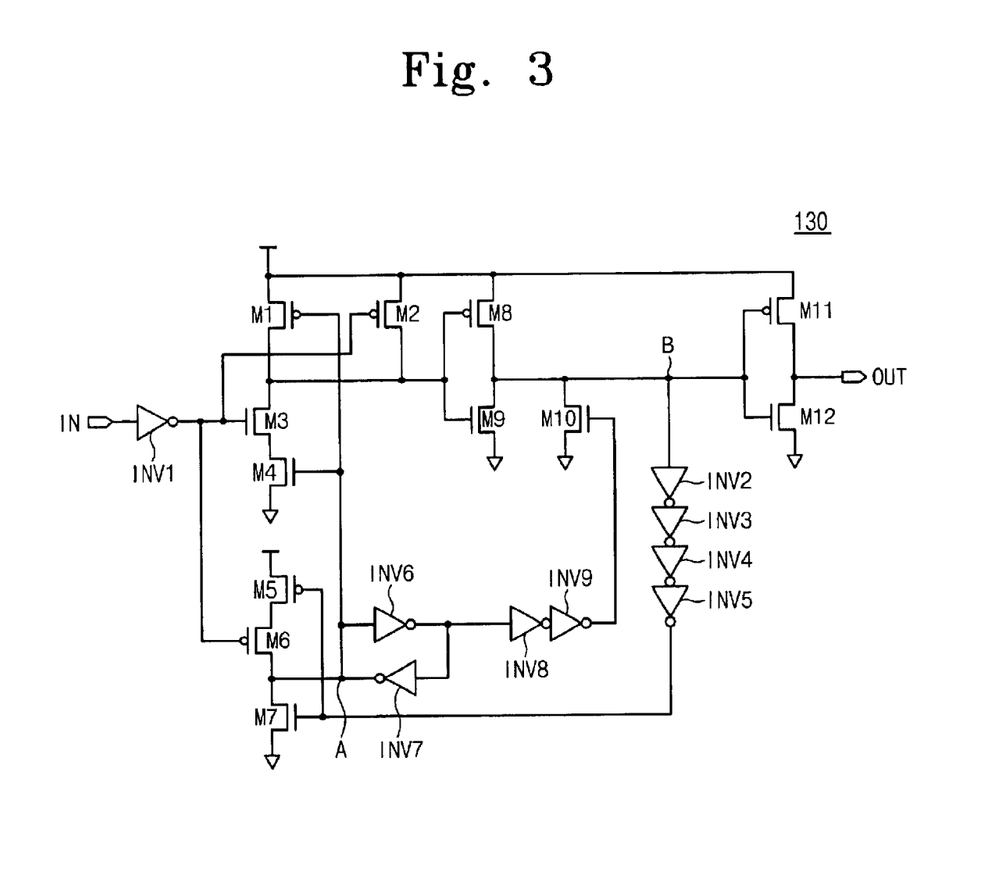
FIG. 3 illustrates a driving circuit of FIG. 2 according to an exemplary embodiment of the present invention.

FIG. 3 illustrates the driving circuit 130 of FIG. 2 according to an exemplary embodiment of the present invention. Referring to FIG. 3, the driving circuit 130 includes a plurality of positive channel metal oxide semiconductor (PMOS) transistors M1, M2, M5, M6, M8 and M11, and negative channel metal oxide semiconductor (NMOS) transistors M3, M4, M7, M9, M10, and M12, and inverters INV1, INV2, INV3, INV4, INV5, INV6, INV7, INV8 and INV9. The driving circuit 130 is a self reset CMOS circuit. An operation of the driving circuit 130 will be described below.

When an input signal IN is at a high level, the MOS transistors M2, M5, M6, M9 and M11 are turned on to set an output signal OUT at a high level. When the input signal IN changes from a high level to a low level, the MOS transistors M3, M8 and M12 are turned on and the MOS transistors M2, M9 and M11 are turned off. When an internal node B changes from a low level to a high level, the MOS transistor M1 is turned on and the MOS transistor M4 is turned off after the delay time of a signal path that extends between the inverters INV2–INV5 and the MOS transistor M7. As a result, the output signal OUT changes from a low level to a high level. As the internal node B changes from a high level to a low level, the driving circuit 130 is automatically initialized to receive another signal. In other words, the MOS transistors M4 and M5 are turned on and the MOS transistors M1 and M7 are turned off. It is to be understood that the regenerator circuits 140 and 200 of FIG. 2 have the same or similar structure as the driving circuit 130.

Figure 4A:
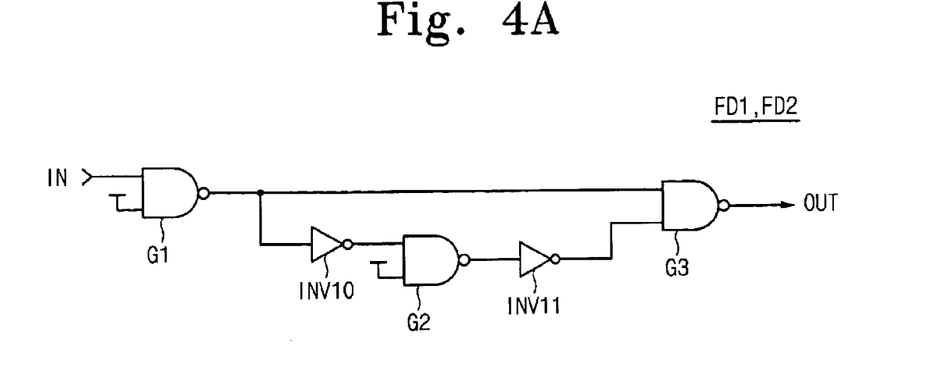
FIG. 4A illustrates a delay unit of a forward delay array of FIG. 2 according to an exemplary embodiment of the present invention.

FIG. 4A illustrates one of the delay units FD1 and FD2 of the forward delay array 150 of FIG. 2 according to an exemplary embodiment of the present invention. Referring to FIG. 4A, one of the delay units for example, FD1, includes NAND gates G1, G2 and G3 and inverters INV10 and INV11. When an input signal IN is at a high level, the output signal OUT goes to a high level. When the input signal IN changes from a high level to a low level, the output signal OUT changes from a high level to a low level. After the time delay of the signal path that extends between the inverters INV10 and INV11 and the NAND gate G2, the output signal OUT changes from a low level to a high level. In other words, each one of the delay units FD1 and FD2 forms a pulse generator.

Figure 4B:
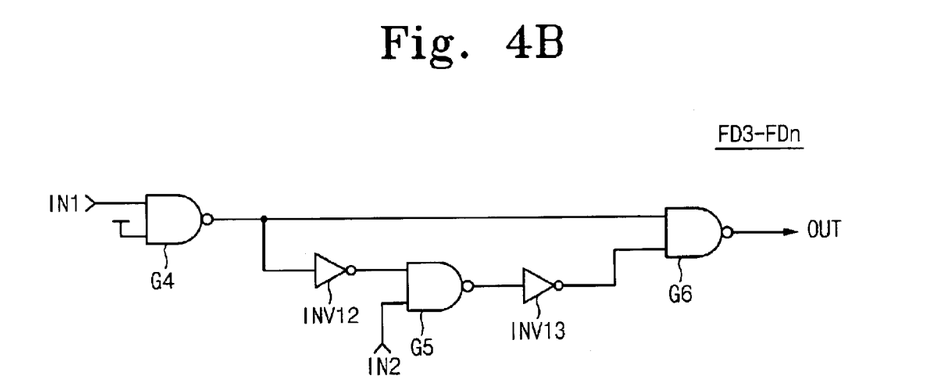
FIG. 4B illustrates another delay unit of a forward delay array of FIG. 2 according to an exemplary embodiment of the present invention.

FIG. 4B illustrates one of delay units FD3–FDn of the forward delay array 150 of FIG. 2 according to an exemplary embodiment of the present invention. Referring to FIG. 4B, one of the delay units for example, FD3, includes NAND gates G4, G5 and G6 and inverters INV12 and INV13. An input signal IN1 is a delay clock signal that is output from a previous delay unit for example, FD2, and an input signal IN2 is a signal that is output to a corresponding phase detector for example, PD3. When the input signals IN1 and IN2 are at a high level, an output signal OUT goes to a high level. In a state where the input signal IN2 is maintained at a high level, if the input signal IN1 changes from a high level to a low level, the output signal OUT changes from a high level to a low level. After the time delay of the signal path that extends between the inverters INV12 and INV13 and a NAND gate G5, the output signal OUT changes from a low level to a high level. On the other hand, when the input signal IN2 is maintained at a low level, the output signal OUT is maintained at a high level without regard to a high-to-low transition of the input signal IN1. In other words, when the delay clock signal output from the (N−1)-th delay unit is synchronized with the reference clock signal, the N-th delay unit is inactivated by the output signal of the phase detector disposed before the (N−1)-th delay unit.

Figure 4C:
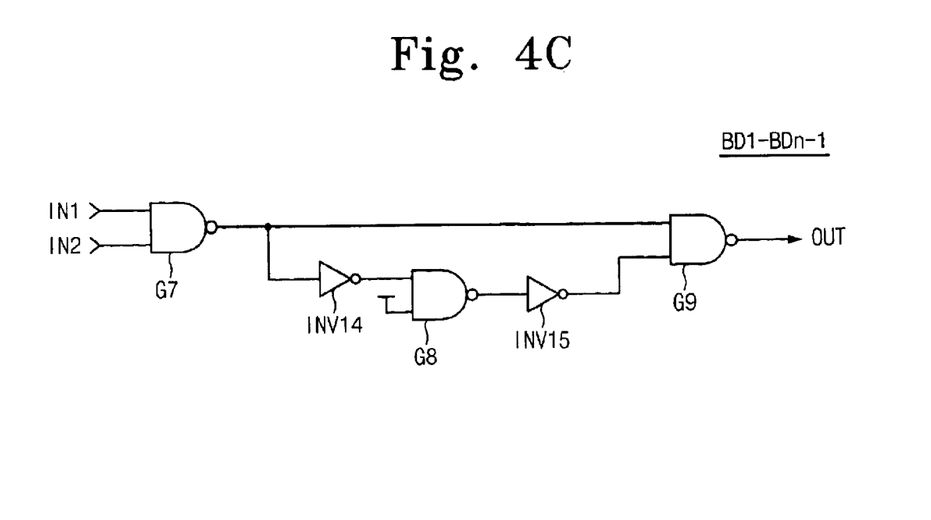
FIG. 4C illustrates a delay unit of a backward delay array of FIG. 2 according to an exemplary embodiment of the present invention.

FIG. 4C illustrates one of the delay units BD1–BDn−1 of the backward delay array 180 of FIG. 2 according to an exemplary embodiment of the present invention. Referring to FIG. 4C, one of the delay units for example, BD1, includes NAND gates G7, G8 and G9 and inverters INV14 and INV15. An input signal IN1 is a signal that is output from a previous delay unit, and an input signal IN2 is a signal that is output from a corresponding phase detector. When both of the input signals IN1 and IN2 are at a high level, an output signal OUT is maintained at a high level. If the input signal IN2 changes from a high level to a low level in a state where the input signal IN1 is maintained at a high level, the output signal OUT changes from a high level to a low level. After the time delay of the signal path that extends between the inverters INV14 and INV15 and a NAND gate G8, the output signal OUT changes from a low level to a high level. In other words, when the (N−1)-th delay unit detects a phase synchronization, a clock signal is generated from the delay unit that receives the output of the (N−1)-th phase detector. It is to be understood that the delay array BDn corresponding to the last phase detector PDn is the same or similar to that of the delay array BDn-1 of FIG. 4C, except that the input signal IN1 is maintained by a power supply voltage.

Figure 4D:
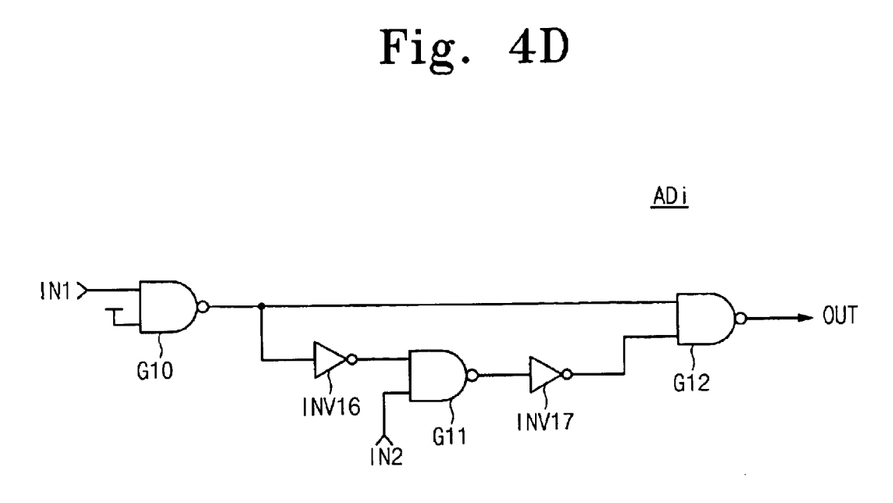
FIG. 4D illustrates a delay unit of a delay circuit of FIG. 2 according to an exemplary embodiment of the present invention.

FIG. 4D illustrates one of the delay units ADi (i=1, 2, . . . , n) of the delay circuit 160 of FIG. 2 according to an exemplary embodiment of the present invention. Referring to FIG. 4D, the delay unit ADi includes NAND gates G10, G11 and G12 and inverters INV16 and INV17. An input signal IN1 is a signal that is output from a previous delay unit or the forward delay array 150, and an input signal IN2 is a signal that is output from the last phase detector PDn. When the input signal IN2 is at a low level, the input signal IN1 is not transmitted to the output and when the last phase detector PDn detects a phase synchronization, the delay circuit 160 is inactivated. As a result, the output signal ADout is kept at a high level.

Figure 4E:
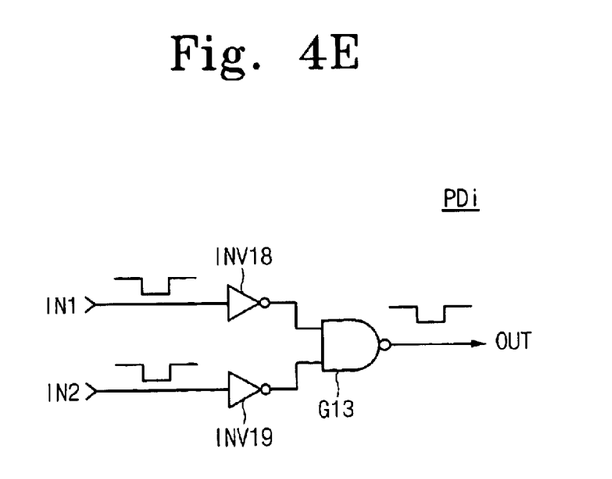
FIG. 4E illustrates a phase detector of a mirror control circuit of FIG. 2 according to an exemplary embodiment of the present invention.

FIG. 4E illustrates one of the phase detectors PDi of the mirror control circuit 170 of FIG. 2 according to an exemplary embodiment of the present invention. Referring to FIG. 4E, one of the phase detectors for example, PDi, includes inverters INV18 and INV19 and a NAND gate G13. An input signal IN1 is the reference clock signal CLKref, and an input signal IN2 is a delay clock signal that is output from a corresponding delay unit for example, ADi. When the input signals IN1 and IN2 have the same phase, the clock signal OUT is generated.

Figure 5:
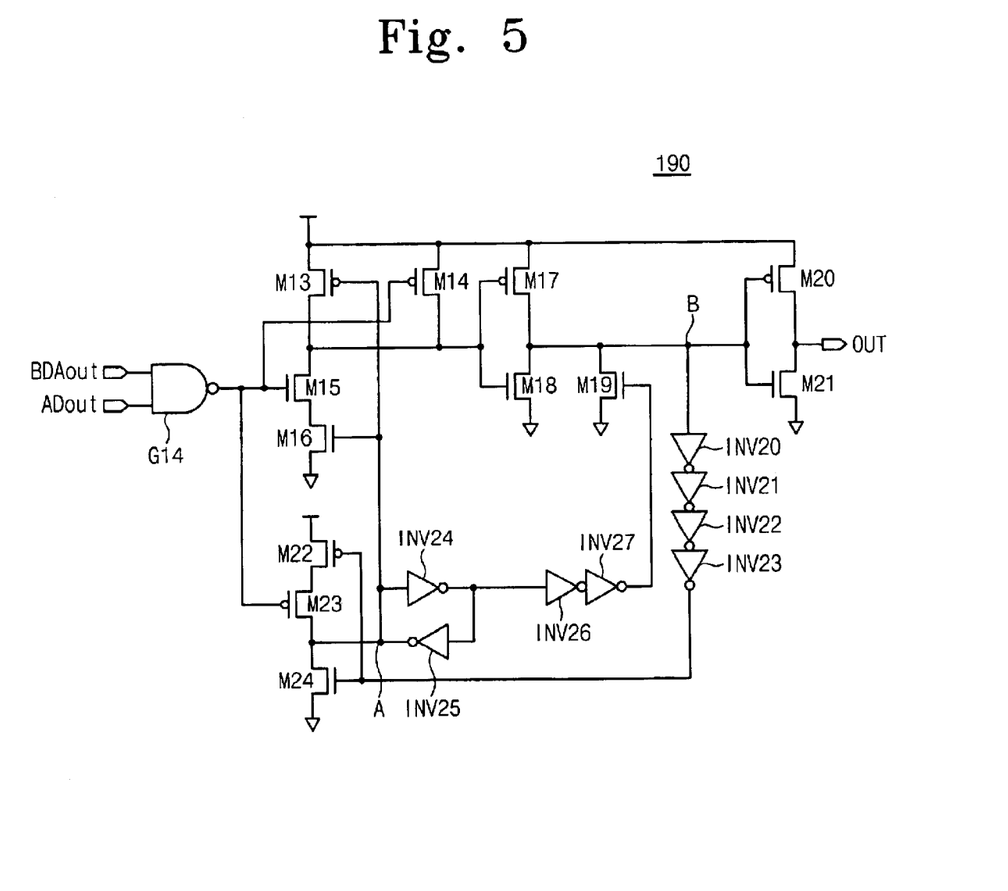
FIG. 5 illustrates a driving circuit of FIG. 2 according to an exemplary embodiment of the present invention.

FIG. 5 illustrates the driving circuit 190 of FIG. 2 according to an exemplary embodiment of the present invention. Referring to FIG. 5, the driving circuit 190 includes a plurality of PMOS transistors M13, M14, M17, M20, M22 and M23, and NMOS transistors M15, M16, M18, M19, M21 and M24, inverters INV20, INV21, INV22, INV23, INV24, INV25, INV26 and INV27, and a NAND gate G14. An input signal BDAout is a synchronous clock signal that is output from the backward delay array 180, and an input signal ADout is an asynchronous clock signal that is output from the delay circuit 160. The driving circuit 190 is a self reset CMOS circuit. An operation of the driving circuit 190 will be described below.

When the input signals BDAout and ADout are at a high level, the MOS transistors M14, M18, M19, M20 and M22 are turned on and an output signal OUT is maintained at a high level. When one of the input signals BDAout and ADout changes from a high level to a low level, the MOS transistors M15, M17 and M21 are turned on and the MOS transistors M14, M18 and M20 are turned off. When an internal node B changes from a low level to a high level, the MOS transistor M13 is turned on and the MOS transistor M16 is turned off after the delay time of the signal path that extends between the inverters INV20–INV23 and the MOS transistor M24. As a result, the output signal OUT changes from a low level to a high level. As the internal node B changes from a high level to a low level, the driving circuit 190 is automatically initialized to receive another signal. In other words, the MOS transistors M16 and M22 are turned on and the MOS transistors M13 and M24 are turned off.

When one of the delay clock signals FDA1–FDAn output from the forward delay array 150 is synchronized with the reference clock signal CLKref, the driving circuit 190 generates the clock signal BDAout output from the backward delay array 180 as a synchronous internal clock signal ICLK that is synchronized with the external clock signal XCLK. When one of the delay clock signals FDA1–FDAn output from the forward delay array 150 is not synchronized with the reference clock signal CLKref, the driving circuit 190 generates the clock signal ADout output from the delay circuit 160.

Figure 6:
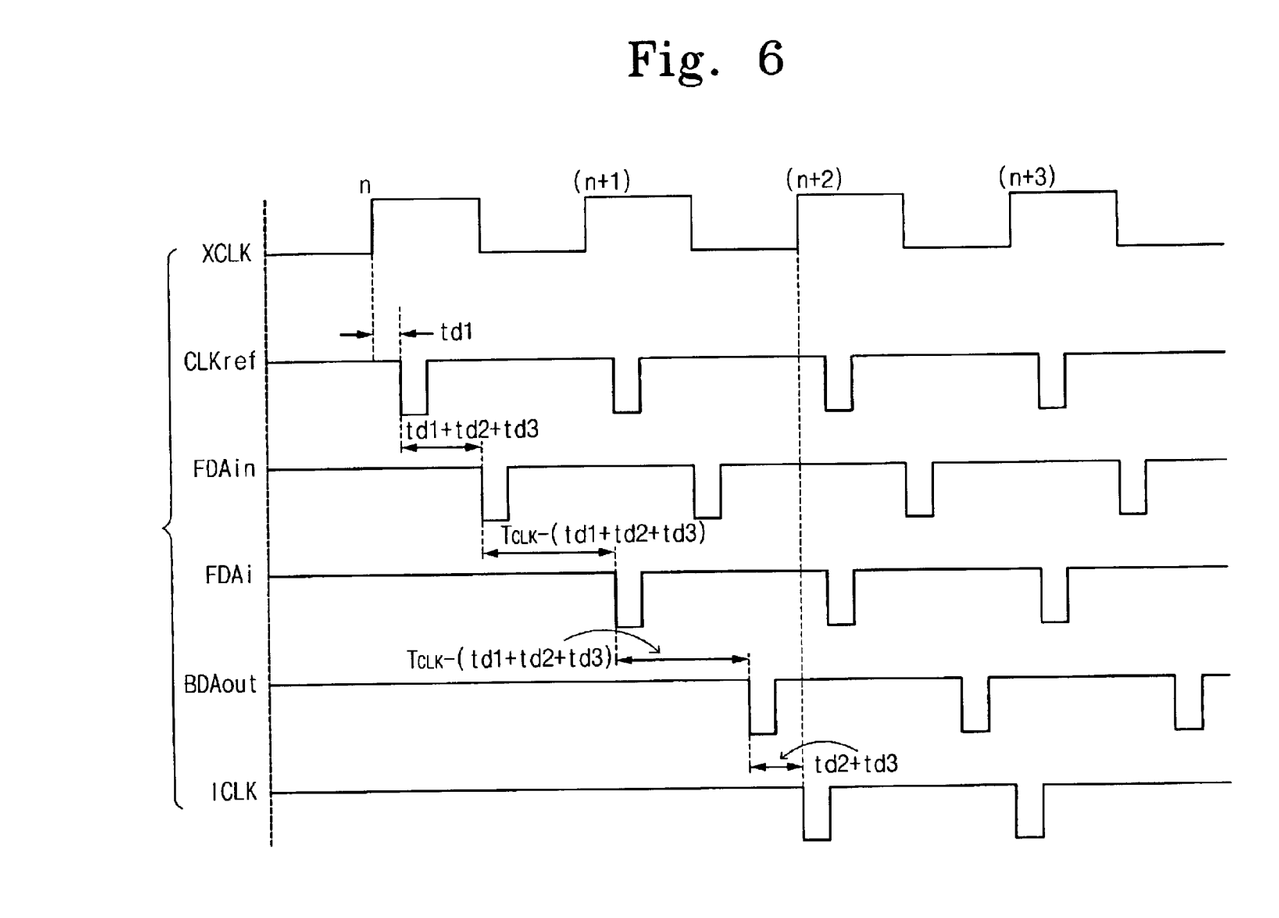
FIG. 6 is a time chart illustrating an operation of a synchronous mirror delay circuit according to an exemplary embodiment of the present invention.

FIG. 6 is a time chart illustrating an operation of the synchronous mirror delay circuit 100 according to an exemplary embodiment of the present invention. The operation of the synchronous mirror delay circuit 100 will be described with reference to FIGS. 1–5.

As shown in FIG. 6, when the external clock signal XCLK is input from an exterior such as a data input/output pad, the clock buffer circuit 110 generates a reference clock signal CLKref in response to the external clock signal XCLK. The reference clock signal CLKref is delayed by a delay time "Td1" through the clock buffer circuit 110. Then, the delay monitor circuit consisting of the clock buffer circuit 120, the driving circuit 130 and the regenerator circuit 140 delays the reference clock signal CLKref by a delay time "Td1+Td2+Td3". The clock signal FDAin output from the delay monitor circuit is input to the forward delay array 150. The forward delay array 150 sequentially delays the clock signal FDAin by means of the delay units FD1–FDn. The mirror control circuit 170 compares the reference clock signal CLKref with each of the delay clock signals FDA1–FDAn, and generates a pulse signal at a position where the input clock signals have the same phase with each other.

For example, one of the signals output from the mirror control circuit 170 is a low pulse signal and the other signals are maintained at a high level. In other words, the mirror control circuit 170 detects a delay clock signal FDAi that is delayed by one cycle compared with the reference clock signal CLKref output from the clock buffer circuit 110 for example, a delay clock signal FDAi having a phase difference of one cycle. The detected delay clock signal FDAi is output as the internal clock signal ICLK through the backward delay array 180, the driving circuit 190 and the regenerator circuit 200.

Equation 1 represents a time necessary for the internal clock signal ICLK to be synchronized with the external clock signal XCLK.

$$T\_tot=Td1+(Td1+Td2+Td3)+2\{Tclk-(Td1+Td2+Td3)\}+(Td2+Td3)=2Tclk \quad [\text{Equation 1}]$$

In equation 1, "Td1" is the delay time of the clock buffer circuit 110, "Td1+Td2+Td3" is the delay time of the delay monitor circuit and "Tclk–(Td1 +Td2+Td3)" is the delay time of each of the forward and backward delay arrays 150 and 180 at the position where the reference clock signal CLKref supplied to the mirror delay circuit 170 and the clock signal passing the forward delay array 150 are synchronized with each other, "Td2" is the delay time of each of the driving circuits 130 and 190, and "Td3" is the delay time of each of the regenerator circuits 140 and 200.

As indicated by Equation 1, the internal clock signal ICLK is synchronized with the external clock signal XCLK after two cycles. In other words, the internal clock signal ICLK is synchronized with the (n+2)-th external clock signal XCLK with reference to the n-th external clock signal XCLK, as shown in FIG. 6. After two cycles from the input time of external clock signal XCLK, the internal clock signal synchronized with the external clock signal XCLK is generated.

Figure 7:
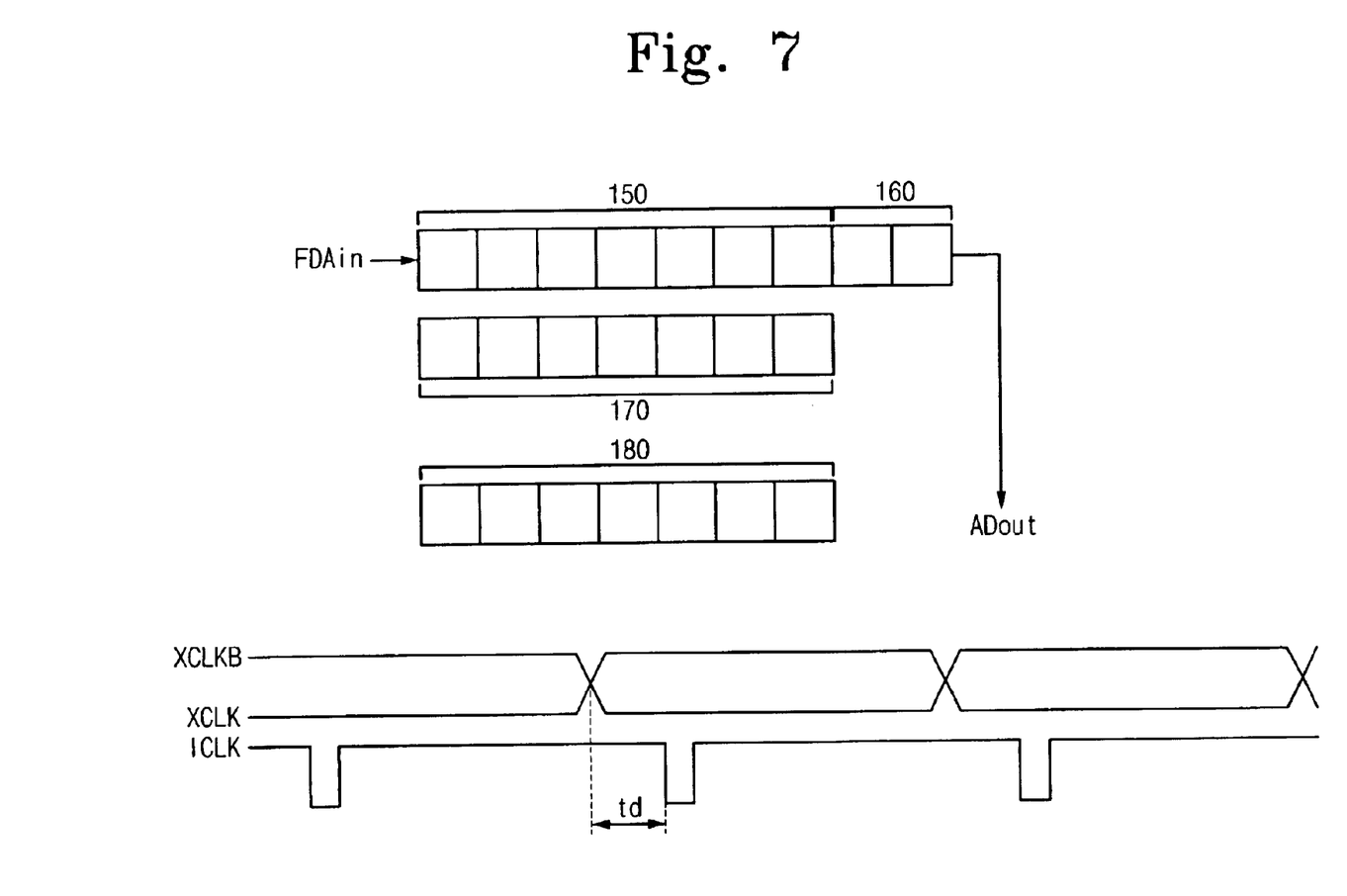
FIG. 7 illustrates an operation of generating an internal clock signal when an external clock signal is out of a synchronization range.

If the delay clock signals generated by the forward delay array 150 are not synchronized with the reference clock signal CLKref, that is, if the operating frequency of the external clock signal XCLK is out of a synchronization range, the input clock signal FDAin is transmitted to the delay circuit 160 through the forward delay array 150 and the delay circuit 160 delays the clock signal output from the forward delay array 150. The delayed clock signal ADout will be output as the internal clock signal ICLK through the driving circuit 190 and the regenerator circuit 200. At this time, the external clock signal XCLK changes from a low level to a high level. After a predetermined time tD elapses, the internal clock signal XCLK changes from a high level to a low level, as shown in FIG. 7.

In this situation, the delay time "tD" is (2td1+2td2+2td3+td4+td5), where "td4" is the total delay time of the delay units FD1–FDn of the forward delay circuit 150 and "td5" is the total delay time of the delay units AD1–ADn of the delay circuit 160.

Even though the synchronous mirror circuit of the present invention operates at a low frequency in which the external clock signal XCLK is out of the phase synchronous range, a semiconductor integrated circuit device employing the synchronous mirror delay circuit according to the present invention can operate normally for example, in its typical operating frequency range, depending on the clock signal ADout output from the delay circuit 160. Although the internal clock signal ICLK is not synchronized with the external clock signal XCLK, the data input/output operation of the transceiver circuit 300 can be performed with sufficient setup/hold margins because the external clock signal XCLK has a low frequency.

Figure 8:
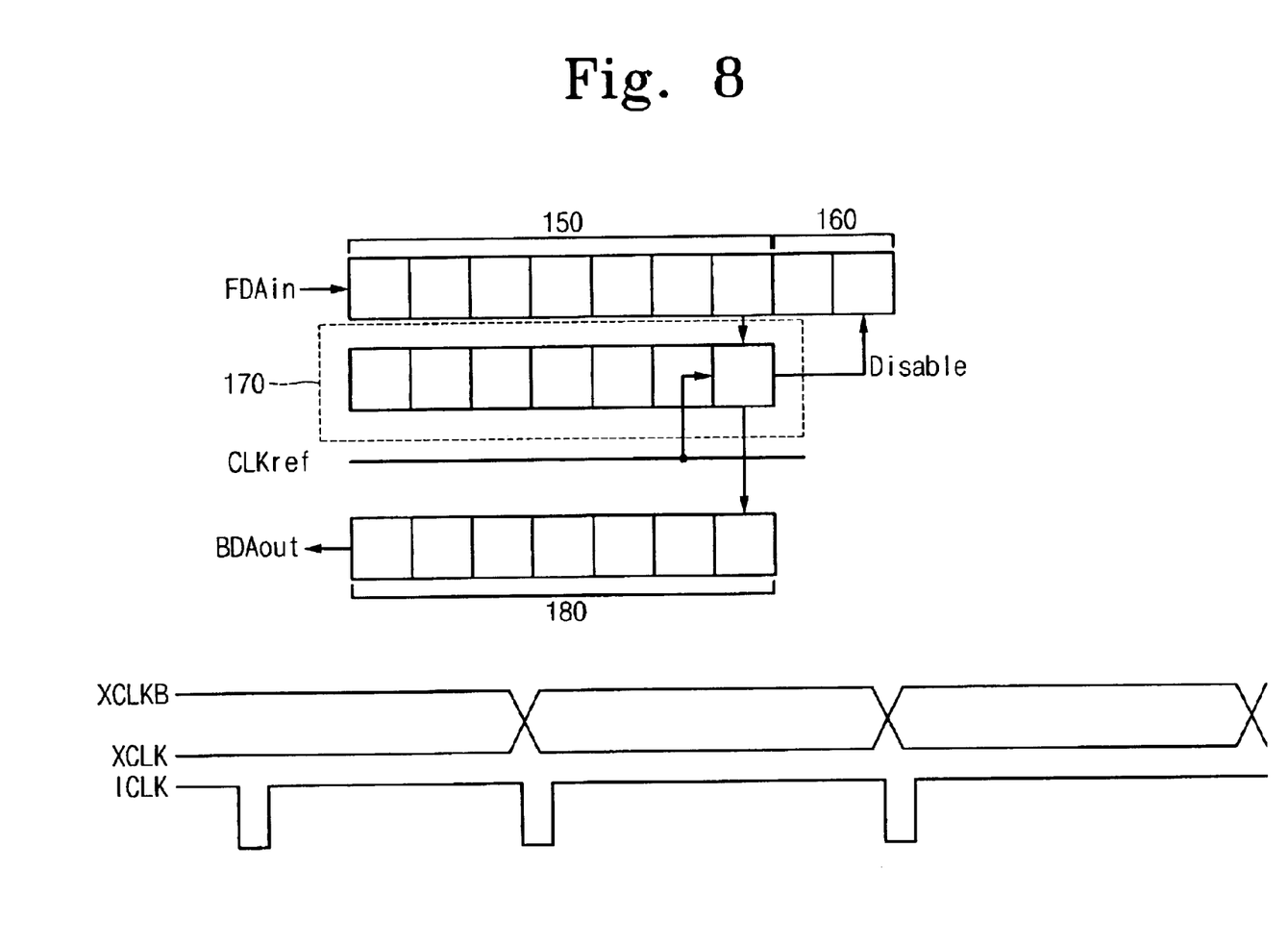
FIG. 8 illustrates an inactivation operation of a delay circuit when a delay clock signal is synchronized with a reference clock signal.

If the internal clock signal ICLK synchronized with the external clock signal XCLK is generated, the delay circuit 160 is prevented from outputting the clock signal ADout. For example, when the delay clock signal FDAn output from the last delay unit FDn of the forward delay array 150 is synchronized with the reference clock signal CLKref, the delay circuit 160 is inactivated by the output signal of the phase detector PDn corresponding to the delay unit PDn, as shown in FIG. 8. As a result, the clock signal ADout is not output from the delay circuit 160. Thus, the internal clock signal (described above) can be generated not only at the operating frequency in a synchronization range but also at the operating frequency out of a synchronization range. Accordingly, a semiconductor integrated circuit device employing the synchronous mirror delay circuit of the present invention can be tested with the test equipment having a low operating frequency.

Although exemplary embodiments of the present invention have been disclosed for illustrative purposes, those skilled in the art will appreciate that various modifications, additions and substitutions are possible, without departing from the scope and spirit of the invention as described in the accompanying claims and their equivalents.

What is claimed is:

1. A synchronous mirror delay circuit for generating an internal clock signal synchronized with an external clock signal, the synchronous mirror delay circuit comprising:
   a clock buffer circuit for generating a reference clock signal in response to the external clock signal;
   a delay monitor circuit for delaying the reference clock signal;
   a forward delay array for delaying an output clock signal of the delay monitor circuit to generate delay clock signals;
   a mirror control circuit for receiving the delay clock signals and the reference clock signal and detecting one delay clock signal synchronized with the reference clock signal among the delay clock signals;
   a backward delay array for delaying the detected delay clock signal to output a synchronous clock signal;
   a delay circuit for delaying an asynchronous clock signal output through the forward delay array; and
   a clock driving circuit for outputting the delayed asynchronous clock signal as the internal clock signal when the reference clock signal is not synchronized with one of the delay clock signals.

2. The synchronous mirror delay circuit of claim 1, wherein the forward delay array comprises serially-connected delay units having the same delay time.

3. The synchronous mirror delay circuit of claim 2, wherein the mirror control circuit comprises phase detectors corresponding to respective delay units, the phase detectors receiving the reference clock signal and the delay clock signal outputted from the corresponding delay unit.

4. The synchronous mirror delay circuit of claim 3, wherein the delay circuit is inactivated by an output signal of the last phase detector when the last phase detector detects the delay clock signal synchronized with the reference clock signal.

5. The synchronous mirror delay circuit of claim 1, wherein the clock driving circuit outputs a synchronous clock signal output from the backward delay array as the internal clock signal when the reference clock signal is synchronized with one of the delay clock signals.

6. The synchronous mirror delay circuit of claim 1, wherein the delay monitor circuit comprises:
   a second clock buffer circuit;
   a first driving circuit; and
   a first regenerator circuit.

7. The synchronous mirror delay circuit of claim 1, wherein the clock driving circuit comprises:
   a second driving circuit; and
   a second regenerator circuit.

8. A semiconductor integrated circuit device operating in synchronization with an external clock signal, the semiconductor integrated circuit device comprising:
   a synchronous mirror delay circuit for generating an internal clock signal synchronized with the external clock signal; and
   a data input/output circuit for inputting and outputting data in synchronization with the internal clock signal,
   wherein the synchronous mirror delay circuit comprises:
   a clock buffer circuit for generating a reference clock signal in response to the external clock signal;
   a delay monitor circuit for delaying the reference clock signal;
   a forward delay array for delaying an output clock signal of the delay monitor circuit to generate delay clock signals;
   a mirror control circuit for receiving the delay clock signals and the reference clock signal and detecting one delay clock signal synchronized with the reference clock signal among the delay clock signals;
   a backward delay array for delaying the delay clock signal detected by the mirror control circuit and outputting a synchronous clock signal;
   a delay circuit for delaying an asynchronous clock signal output through the forward delay array; and
   a clock driving circuit for outputting the delayed asynchronous clock signal as the internal clock signal when the reference clock signal is not synchronized with one of the delay clock signals.

9. The semiconductor integrated circuit device of claim 8, wherein the forward delay array comprises serially-connected delay units having the same delay time.

10. The semiconductor integrated circuit device of claim 9, wherein the mirror control circuit comprises phase detectors corresponding to the delay units, the phase detectors receiving the reference clock signal and the delay clock signal outputted from the corresponding delay unit.

11. The semiconductor integrated circuit device of claim 10, wherein the delay circuit is inactivated by an output signal of the last phase detector when the last phase detector detects the delay clock signal synchronized with the reference clock signal.

12. The semiconductor integrated circuit device of claim 8, wherein the clock driving circuit outputs a synchronous clock signal output from the backward delay array as the internal clock signal when the reference clock signal is synchronized with one of the delay clock signals.

13. A method for generating an internal clock signal synchronized with an external clock signal, the method comprising the steps of:

generating a reference clock signal in response to the external clock signal;

delaying the reference clock signal;

sequentially delaying an output clock signal to generate an asynchronous clock signal and delay clock signals;

detecting one delay clock signal synchronized with the reference clock signal among the delay clock signals;

delaying the detected delay clock signal to output a synchronous clock signal; and outputting the asynchronous clock signal as the internal clock signal, when the reference clock signal is not synchronized with one of the delay clock signals.

14. The method of claim 13, further comprising outputting the synchronous clock signal as the internal clock signal when the reference clock signal is synchronized with one of the delay clock signals.

15. The method of claim 13, wherein the asynchronous clock signal is not generated when the last delayed delay clock signal of the delay clock signals is synchronized with the reference clock signal.

* * * * *